(12) United States Patent
Tanaka et al.

(10) Patent No.: US 7,856,066 B2
(45) Date of Patent: Dec. 21, 2010

(54) OFDM RECEIVER AND DOPPLER FREQUENCY ESTIMATING CIRCUIT

(75) Inventors: Masato Tanaka, Tokyo (JP); Hiroji Akahori, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 606 days.

(21) Appl. No.: 11/923,212

(22) Filed: Oct. 24, 2007

(65) Prior Publication Data

US 2008/0101215 A1 May 1, 2008

(30) Foreign Application Priority Data

| Oct. 27, 2006 | (JP) | ............................. 2006-292399 |
| Feb. 22, 2007 | (JP) | ............................. 2007-042060 |
| Sep. 28, 2007 | (JP) | ............................. 2007-253540 |

(51) Int. Cl.
  *H04K 1/10* (2006.01)
  *H04L 27/28* (2006.01)
(52) U.S. Cl. ........................ 375/260; 370/203; 370/208; 370/210; 342/99
(58) Field of Classification Search ................. 375/260; 370/203–211; 342/99
  See application file for complete search history.

(56) References Cited

U.S. PATENT DOCUMENTS

2004/0005018 A1* 1/2004 Zhu et al. .................... 375/340

FOREIGN PATENT DOCUMENTS

| JP | 2000-022661 | 1/2000 |
| JP | 2004-153811 | 5/2004 |
| JP | 2005-045664 | 2/2005 |

* cited by examiner

*Primary Examiner*—Curtis B Odom
(74) *Attorney, Agent, or Firm*—Studebaker & Brackett PC; Donald R. Studebaker (57) ABSTRACT

A radiofrequency signal is converted to an intermediate frequency signal by a tuner, which is amplified by a variable gain amplifier. The so-amplified signal is converted into a digital signal by an ADC, which is supplied to an FFT, where it is separated into signals set every carrier, followed by being supplied to equalizers different in characteristic. The digital signal outputted from the ADC is further supplied to a level converting circuit from which a control signal is generated. The control signal is supplied to a DAC and a Doppler frequency detector. The DAC generates a gain control signal and supplies the same to the variable gain amplifier. The Doppler frequency detector outputs a frequency component of the control signal as a Doppler detection signal. The Doppler detection signal is compared with a threshold value by a comparator. A selector selects one of signals outputted from the equalizers, in accordance with a select signal indicative of the result of comparison.

8 Claims, 5 Drawing Sheets

OFDM RECEIVER AND DOPPLER FREQUENCY ESTIMATING CIRCUIT

BACKGROUND OF THE INVENTION

The present invention relates to an OFDM (Orthogonal Frequency Division Multiplex) receiver such as a digital terrestrial broadcasting receiver, and particularly to a Doppler frequency detector for generating a signal for switching equalizers each of which equalizes a fast Fourier-transformed signal, according to a Doppler frequency.

Figure 2:
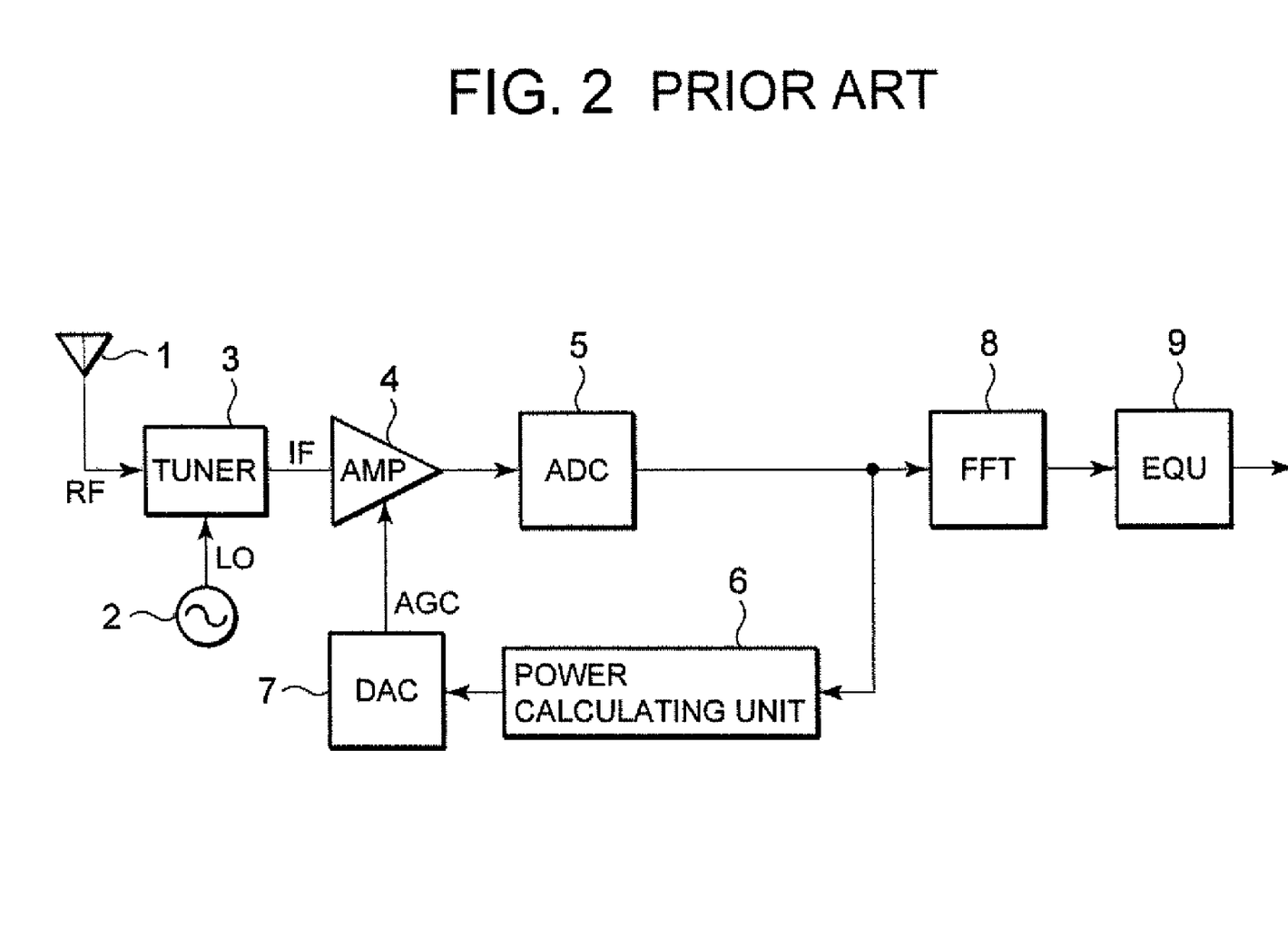
FIG. 2 is a schematic block diagram illustrating a conventional digital terrestrial broadcasting receiver.

FIG. 2 is a schematic block diagram of a conventional digital terrestrial broadcasting receiver.

The digital terrestrial broadcasting receiver has an antenna 1 which receives an OFDM-modulated wireless or radiofrequency signal RF lying in an UHF (Ultra High Frequency) band, and a tuner 3 which frequency-converts the radiofrequency signal RF received by the antenna 1 in accordance with a local oscillation signal LO of a local oscillator 2 to generate or produce an intermediate frequency signal IF of a desired reception channel. The intermediate frequency signal IF is amplified in such a manner that average power becomes a constant value by a variable gain amplifier (hereinafter called "AMP") 4 whose amplification factor or gain is controlled by a gain control signal AGC, followed by being supplied to an analog-digital converter (hereinafter called "ADC") 5. A power calculating unit 6 is connected to an output side of the ADC 5.

The power calculating unit 6 calculates a value corresponding to the average power of the output signal of the AMP 4, based on a time domain signal converted to a digital value by the ADC 5. An output signal CON of the power calculating unit is supplied to a digital-analog converter (hereinafter called "DAC") 7, where it is converted into an analog signal, which in turn is supplied to the AMP 4 as a gain control signal AGC.

Further, a fast Fourier transformer (hereinafter called "FFT") 8 is connected to the output side of the ADC 5. The FFT 8 converts the time domain signal converted to the digital value by the ADC 5 to signals in a frequency domain corresponding to a plurality of carriers that constitute OFDM. An equalizer (EQU) 9, which makes synchronization between the carriers to generate received data, is connected to an output side of the FFT 8. Further, an error correction unit, a video-audio reproduction unit and the like, although not shown in the figure, are connected to an output side of the equalizer 9.

In the digital terrestrial broadcasting receiver, a desired signal is selected by the tuner 3 from the radiofrequency signal RF received by the antenna 1 and converted to an intermediate frequency signal IF. A plurality of carriers have been multiplexed into the intermediate frequency signal IF. The respective carriers have been quadrature-modulated based on data constituting broadcast contents and control signals. The intermediate frequency signal IF is amplified to a predetermined level by the AMP 4, which in turn is supplied to the ADC 5, where it is converted into a digital value in accordance with a sampling clock CLK. The received signal converted to the digital value by the ADC 5 is supplied to the FFT 8 where it is separated into signals set every carrier, thereby producing received data. The equalizer 9 makes synchronization between the carriers to produce the received data. The received data is played back or reproduced as video and voice by the video-audio reproduction unit or the like.

On the other hand, the received signal converted to the digital value by the ADC 5 is supplied to the power calculating unit 6, where its average power of a predetermined period is calculated. The value of the average power calculated by the power calculating unit 6 is converted into an analog gain control signal AGC by the DAC 7, which is then supplied to the AMP 4. At the AMP 4, its amplification factor or gain is reduced as the gain control signal AGC becomes larger, whereas the amplification factor increases as the gain control signal AGC becomes smaller. Consequently, the average power of the output signal of the AMP 4 converges to a predetermined value.

Thus, the received signal converted to the digital value is obtained suitably from the ADC 5 by setting the average power outputted from the AMP 4 so as to be the optimum input level of the ADC 5.

The above prior art refers to patent documents 1 (Japanese Unexamined Patent Publication No. 2000-22661), 2 (Japanese Unexamined Patent Publication No. 2005-45664) and 3 (Japanese Unexamined Patent Publication No. 2004-153811).

However, although the digital terrestrial broadcasting receiver is configured so as to suppress a variation in reception level and hold a satisfactory receiving state, a variation in delay time due to the Doppler phenomenon occurs along with high-speed fading at which the reception level varies with high-speed movement of a portable terminal, where the digital terrestrial broadcasting receiver is built in the portable terminal, for example. A problem arises in that there is a need to provide two or more equalizers different in characteristic and switch the same according to the conditions of a propagation path for the purpose of improving both characteristics with respect to such high-speed fading and Doppler phenomenon as described above.

When the Doppler frequency at low-speed movement or the like of the portable terminal, a change in gain control signal AGC is reduced. The digital terrestrial broadcasing receiver is accompanied by a problem that since the Doppler frequency is estimated based on the number of states or the like in which changes have occurred, the probability that an erroneous Doppler frequency will be indicated due to degradation of estimated accuracy increases.

SUMMARY OF THE INVENTION

The present invention has been made in view of the foregoing problems. An object of the present invention is to provide an OFDM receiver equipped with a Doppler frequency detector for detecting a variation in delay time and thereby switching equalizers, and a Doppler frequency estimating circuit capable of detecting a Doppler frequency even at low-speed movement thereof, for using in Doppler frequency detection or the like of the OFDM receiver.

According to one aspect of the present invention, for attaining the above object, there is provided an OFDM receiver comprising a tuner which receives a radiofrequency signal subjected to OFDM modulation therein and converts the same to an intermediate frequency signal, an AMP which amplifies the intermediate frequency signal in accordance with a gain control signal, an ADC which converts the signal amplified by the AMP to a digital signal, an FFT which transforms the digital signal into signals in a frequency domain corresponding to a plurality of carriers, an equalizer which processes the signals outputted from the FFT in accordance with a Doppler detection signal thereby to make synchronization between the carriers so as to produce received data, a level control circuit which generates a control signal corresponding to the gain control signal, for bringing an average level of the digital signal to a predetermined level, based on the digital signal, a DAC which analog-converts the control signal to produce the gain control signal, and a Doppler frequency detector which extracts frequency components of the control signal thereby to produce the Doppler detection signal.

According to another aspect of the present invention, for attaining the above object, there is provided a Doppler frequency estimating circuit comprising count means which compares the amplitude of a received signal obtained by demodulating a radiofrequency signal subjected to OFDM modulation with a first threshold value and counts the number of times that the amplitude of the received signal passes through the first threshold value within a predetermined time every predetermined time, compare means which compares a count value of the count means with a second threshold value and thereby outputs a signal indicative of a result of comparison, delay means which delays the signal indicative of the result of comparison by the predetermined time and outputs the same therefrom, difference calculating means which calculates a difference between the signals outputted from the compare means and the delay means, and smoothing means which removes high frequency components contained in the difference calculated by the difference calculating means and outputs a Doppler detection signal.

The OFDM receiver of the present invention is equipped with a Doppler frequency detector which generates a Doppler detection signal using a control signal for controlling the gain of an AMP, and equalizers which process signals outputted from an FFT in accordance with the Doppler detection signal thereby to generate received data. Thus, an advantageous effect is brought about in that suitable reception is enabled at a digital terrestrial broadcasting receiver or the like built in a portable terminal by switching two or more equalizers different in characteristic according to the conditions of a propagation path in which variations in delay time occur due to high-speed fading at which a reception level varies with its high-speed movement, and a Doppler phenomenon.

The Doppler frequency estimating circuit of the present invention generates a Doppler detection signal for estimating a Doppler frequency without performing power calculations by simply using count means and compare means. Thus, an advantageous effect is brought about in that an arithmetic or operational scale is reduced and the Doppler frequency can be estimated with satisfactory accuracy even at high-speed movement or the like.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

The present invention aims to avoid degradation of estimated accuracy even at a low Doppler frequency by generating power variation information on a received signal in finer form. The following processing is carried out.

A power variation in a received OFDM signal is first determined. Next, an arithmetic or operational scale is cut down by utilizing the characteristic of the amplitude of the OFDM signal. That is, the OFDM signal is constituted by adding up a plurality of orthogonal sine waves. The amplitude thereof can be made approximate to a normal distribution. Therefore, the amplitude of the signal z (t) is expressed in the following equation:

$$z(t) = x(t) + jy(t)$$

Assuming that x (t) and y(t) can be made approximate to independent normal distributions respectively, they are expressed as given by the following equations:

$$p(x) = \frac{1}{\sqrt{2\pi}\sigma} e^{-\frac{x^2}{2\sigma^2}}, \; p(y) = \frac{1}{\sqrt{2\pi}\sigma} e^{-\frac{y^2}{2\sigma^2}} \quad (1)$$

Figure 3:
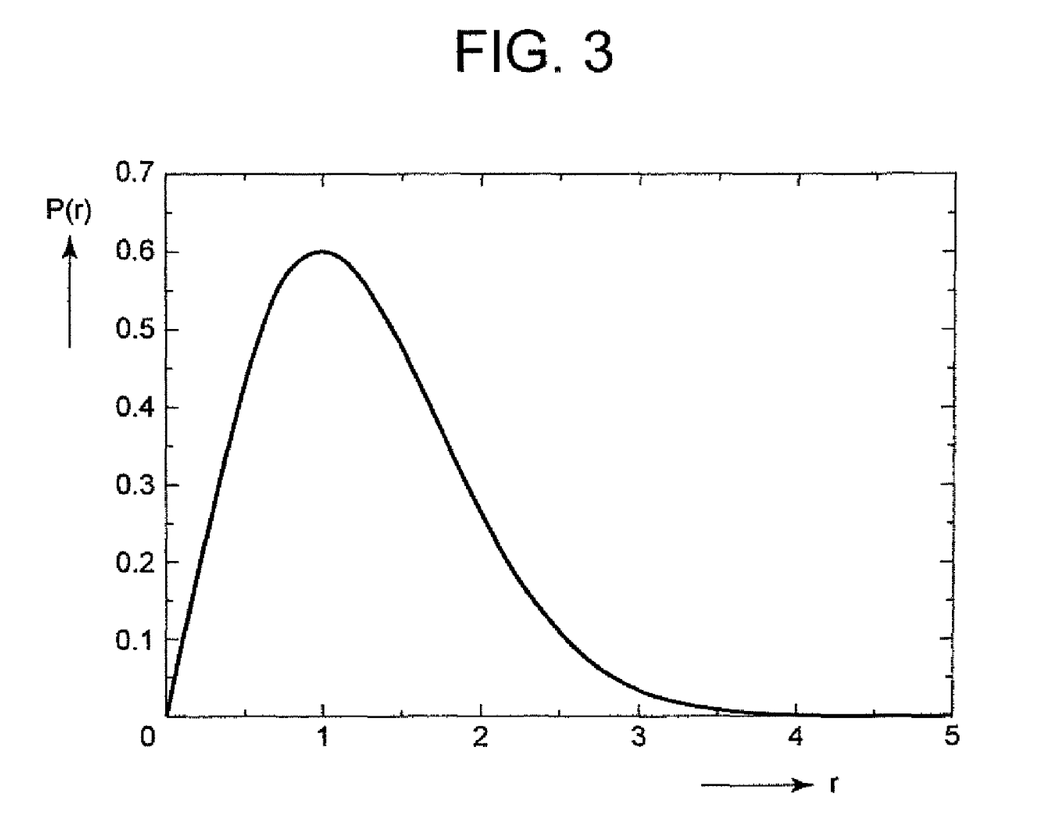
FIG. 3 is a graph showing the relationship between amplitude r and a probability density distribution p (r)

Next, assuming that the amplitude of the present signal is r (t), $r(t) = \sqrt{\{x^2(t) + y^2(t)\}}$. Therefore, a probability density distribution of amplitude p (r) is expressed as follows. FIG. 3 is a graph showing the relationship between amplitude r and a probability density distribution p (r).

$$p(r) = \frac{r}{\sigma^2} e^{-\frac{r^2}{2\sigma^2}} \quad (2)$$

And gain control is carried out on the basis of the signal amplitude distribution contained in the OFDM signal.

The above and other objects and novel features of the present invention will become more completely apparent from the following descriptions of preferred embodiments when the same is read with reference to the accompanying drawings. The drawings, however, are for the purpose of illustration only and by no means limitative of the scope of the invention.

First Preferred Embodiment

Figure 1:
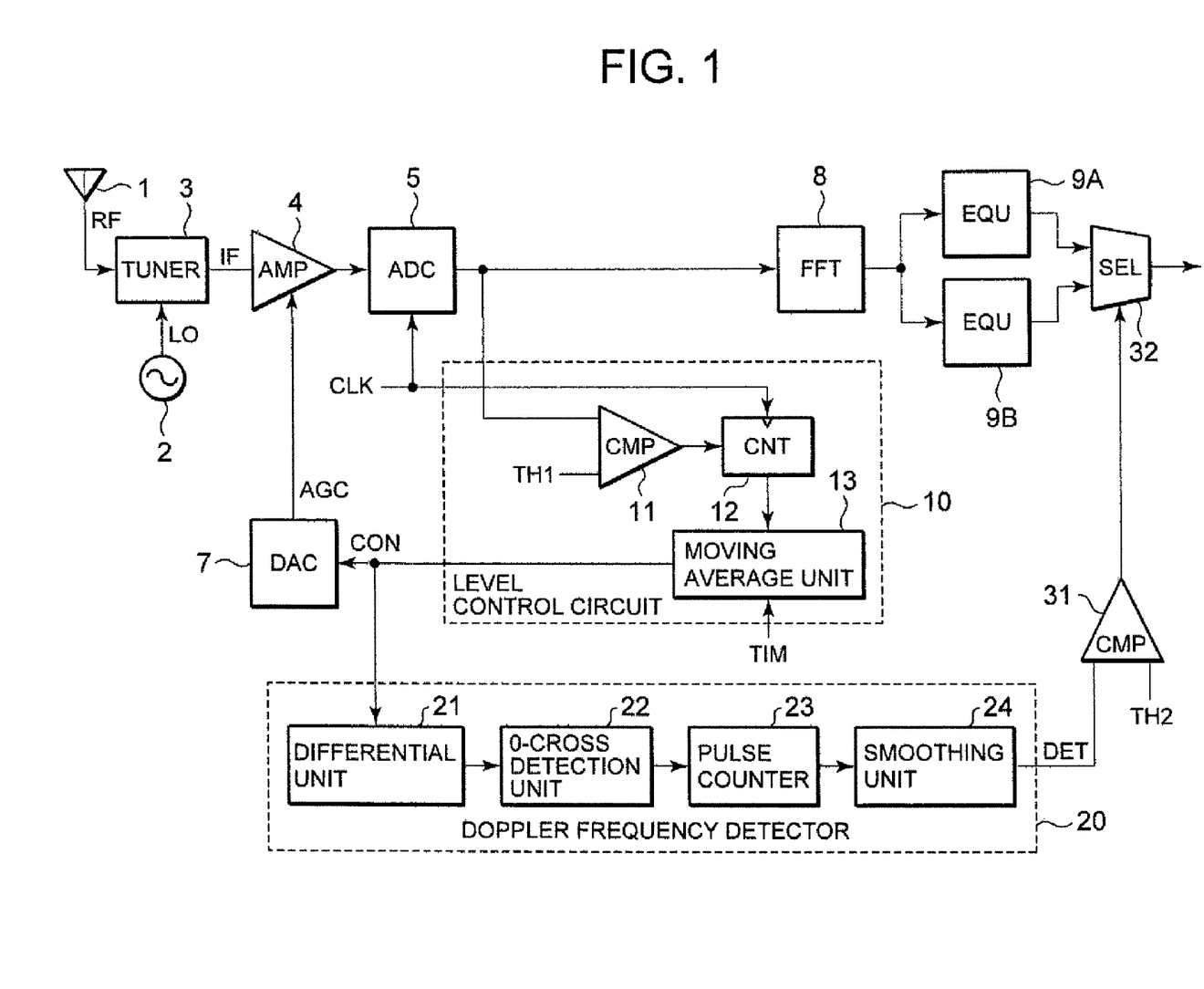
FIG. 1 is a schematic block diagram showing a digital terrestrial broadcasting receiver according to a first embodiment of the present invention.

FIG. 1 is a schematic block diagram showing a digital terrestrial broadcasting receiver according to a first embodiment of the present invention. Elements common to those shown in FIG. 2 are respectively given common reference numerals.

The digital terrestrial broadcasting receiver has an antenna 1 which receives an OFDM-modulated wireless or radiofrequency signal RF lying in an UHF band, and a tuner 3 which frequency-converts the radiofrequency signal RF received by the antenna 1 in accordance with a local oscillation signal LO of a local oscillator 2 to generate or produce an intermediate frequency signal IF of a desired reception channel. The intermediate frequency signal IF is amplified in such a manner that average power becomes a constant value by an AMP 4 whose amplification factor or gain is controlled by a gain control signal AGC, followed by being supplied to an ADC 5. An FFT 8 and a level control circuit 10 are connected to an output side of the ADC 5.

The FFT 8 converts a time domain signal converted to a digital value by the ADC 5 to signals in a frequency domain corresponding to a plurality of carriers that constitute OFDM. Two sets of equalizers (EQU) 9A and 9B, which make synchronization between the carriers to generate received data, are connected to an output side of the FFT 8.

The equalizers 9A and 9B are different in characteristic with respect to variations in delay time due to the Doppler phenomenon. For instance, the equalizer 9A is suitable for an input signal large in variation in delay time by the setting that emphasizes the speed of response. The equalizer 9B indicates a characteristic high in accuracy with respect to an input signal low in delay-time variation. Output sides of the equalizers 9A and 9B are connected to an error correction unit, a video-audio reproduction unit and the like unillustrated in the drawing via a selector 32.

The level control circuit 10 has a comparator (CMP) 11 that compares the signal converted to the digital value by the ADC 5 with a threshold value TH1. The comparator 11 supplies a signal indicative of "1" when the signal outputted from the ADC 5 is larger than the threshold value TH1, to a counter (CNT) 12. When the signal supplied from the comparator 11 is "1" the counter 12 counts a sampling clock CLK of the ADC 5. The count value of the counter 12 is applied to a moving average unit 13.

The moving average unit 13 cumulatively adds each respective count value of the counter 12 for a predetermined period in accordance with a symbol timing signal TIM and outputs an added value thereof as a control signal CON. The control signal CON is supplied to a DAC 7 and a Doppler frequency detector 20.

The DAC 7 converts the control signal CON outputted from the moving average unit 13 of the level control circuit 10 to an analog signal and supplies it to the AMP 4 as a gain control signal AGC.

On the other hand, the Doppler frequency detector 20 detects a variation in receive frequency, i.e., a Doppler frequency due to the movement of the digital terrestrial broadcasting receiver, based on the control signal CON outputted from the moving average unit 13 of the level control circuit 10.

The Doppler frequency detector 20 comprises a differential unit 21, a 0-cross detection unit 22, a pulse counter 23 and a smoothing unit or smoother 24. The differential unit 21 calculates an increase or decrease in the control signal CON outputted from the moving average unit 13 for each symbol timing signal TIM and supplies the result of calculation to the 0-cross detection unit 22. If the control signal CON increases, then the differential unit 21 outputs the result of + therefrom, whereas if the control signal CON decreases, then the differential unit 21 outputs the result of − therefrom.

The 0-cross detection unit 22 detects that the value given from the differential unit 21 crosses 0 and outputs a pulse signal. That is, the 0-cross detection unit 22 outputs pulses signals when the value supplied from the differential unit 21 changes from + to 1 and changes from − to +, respectively.

The pulse counter 23 counts the number of the pulse signals outputted from the 0-cross detection unit 22 during a predetermined period for each predetermined period (e.g., 1 second). Each count value counted by the pulse counter 23 for the predetermined period is supplied to the smoothing unit 24.

The smoothing unit 24 is a low-pass filter that removes high frequency components contained in the count value outputted from the pulse counter 23 and outputs a Doppler detection signal DET. The Doppler detection signal DET is supplied to a comparator 31 where it is compared with a threshold value TH2. A signal indicative of the result of comparison by the comparator 31 is supplied as a select signal for the selector 32.

When the Doppler detection signal DET exceeds the threshold value TH2, the selector 32 selects the equalizer 9A that emphasizes the response speed, in accordance with the select signal. When the Doppler detection signal DET is less than or equal to the threshold value TH2, the selector 32 selects the equalizer 9B that emphasizes accuracy and stability.

The operation of the digital terrestrial broadcasting receiver will next be explained.

In the digital terrestrial broadcasting receiver, a radiofrequency signal RF of 450 MHz to 700 MHz is received by the antenna 1. A signal of a desired channel selected by the tuner 3 is converted into an intermediate frequency signal IF whose band is about 450 MHz, with its center frequency as about 500 kHz. For example, carriers corresponding to 108 waves are multiplexed into the intermediate frequency signal IF. The respective carriers have been quadrature-modulated by data constituting broadcast contents and control signals. The intermediate frequency signal IF outputted from the tuner 3 is amplified to a predetermined level by the AMP 4, which in turn is supplied to the ADC 5, where it is converted into a digital value in accordance with a sampling clock CLK of 2 MHz, for example. The received signal converted to the digital value by the ADC 5 is supplied to the FFT 8 and the level control circuit 10.

The received signal supplied to the FFT 8 is separated into signals set every carrier, which in turn are supplied to the equalizers 9A and 9B. The equalizers 9A and 9B make synchronization between the carriers in accordance with their characteristics to produce received data. Signals outputted from the equalizers 9A and 9B are supplied to the selector 32 where one thereof is selected in accordance with a select signal. The signal selected by the selector 32 is supplied to the unillustrated error correction unit and video-audio reproduction unit or the like as the received data, from which it is played back or reproduced as video and voice.

On the other hand, the received signal supplied to the level control circuit 10 is compared with the threshold value TH1 by the comparator 11. When the level of the received signal is larger than the threshold TH1, the output signal of the comparator 11 is brought to "1" and hence the counter 12 is counted up in accordance with the corresponding sampling clock CLK. Incidentally, when the level of the received signal is less than or equal to the threshold value TH1, the output signal of the comparator 11 is brought to "0", so that the operation of the counter 12 is stopped. Each respective count value of the counter 12 is supplied to the moving average unit 13 for every predetermined period (e.g., period of one symbol corresponding to modulation unit of carrier=about 1 ms).

At the moving average unit 13, each count value of the counter 12 is cumulatively added by a predetermined number of times (e.g., the latest ten times) in accordance with a symbol timing signal TIM to take a moving average. This is outputted as a control signal CON and supplied to the DAC 7 and the Doppler frequency detector 20.

The DAC 7 converts the control signal CON supplied from the moving average unit 13 of the level control circuit 10 into an analog signal, which in turn is applied to the AMP 4 as a gain control signal AGC. Here, when the output level of the ADC 5 rises and the received signal supplied to the level control circuit 10 becomes larger, the frequency with which it exceeds the threshold value TH1, increases. Thus, the count value of the counter 12 increases and hence the control signal CON outputted from the moving average unit 13 also increases. As a result, the gain control signal AGC becomes also larger and hence the gain or amplification factor of the AMP 4 is lowered, thereby reducing the level of the output signal of the AMP 4.

Contrary to it, the output level of the ADC 5 is reduced and the received signal supplied to the level control circuit 10 becomes also smaller, so that the frequency with which it exceeds the threshold value TH1 decreases. Thus, the count value of the counter 12 is reduced and hence the control signal CON outputted from the moving average unit 13 is also reduced. As a result, the gain control signal AGC becomes small and the gain of the AMP 4 rises, so the level of the output signal of the AMP 4 rises. With such feedback action, the average power of the output signal of the AMP 4 converges to a predetermined value.

On the other hand, in the Doppler frequency detector 20, the differential unit 21 calculates an increase or decrease in the control signal CON outputted from the moving average unit 13 for each symbol timing signal TIM and supplies the result of calculation to the 0-cross detection unit 22. The 0-cross detection unit 22 detects the inversion of the sign of the increase or decrease in the control signal CON supplied from the differential unit 21 and outputs each pulse signal each time the sign thereof is reversed.

The pulse signals outputted from the 0-cross detection unit 22 are supplied to the pulse counter 23, where the number of the pulse signals set every predetermined period (1 second, for example) is counted. A count value counted by the pulse counter 23 for the predetermined period is supplied to the smoothing unit 24 where high frequency components are removed, after which it is outputted as a Doppler detection signal DET. That is, the Doppler detection signal DET becomes one corresponding to the frequency of the gain control signal AGC.

The Doppler detection signal DET is compared with the threshold value TH2 applied to the comparator 31. A signal indicative of the result of comparison by the comparator 31 is supplied as a select signal for the selector 32. Thus, when the Doppler detection signal DET exceeds the threshold value TH2, the selector 32 selects the equalizer 9A that emphasizes the speed of response, whereas when the Doppler detection signal DET is less than or equal to the threshold value TH2, the selector 32 selects the equalizer 9B that emphasizes accuracy and stability.

As described above, the digital terrestrial broadcasting receiver according to the first embodiment has the Doppler frequency detector 20, which generates the Doppler detection signal DET, based on the control signal (signal that becomes a source of gain control signal AGC) generated by the level control circuit 10.

There is generally a tendency that when the Doppler frequency is low, a change in gain control signal AGC is gentle and the frequency is low, whereas when the Doppler frequency is high, a change in gain control signal AGC is sharp and the frequency becomes high. Accordingly, an advantage is brought about in that the process of generating the received data by the suitable equalizer by comparing the Doppler detection signal DET generated at the Doppler frequency detector 20 with the threshold value TH2 and selecting one of the equalizers 9A and 9B having the two types of characteristics with the signal indicative of the result of comparison as the select signal.

Second Preferred Embodiment

Figure 4:
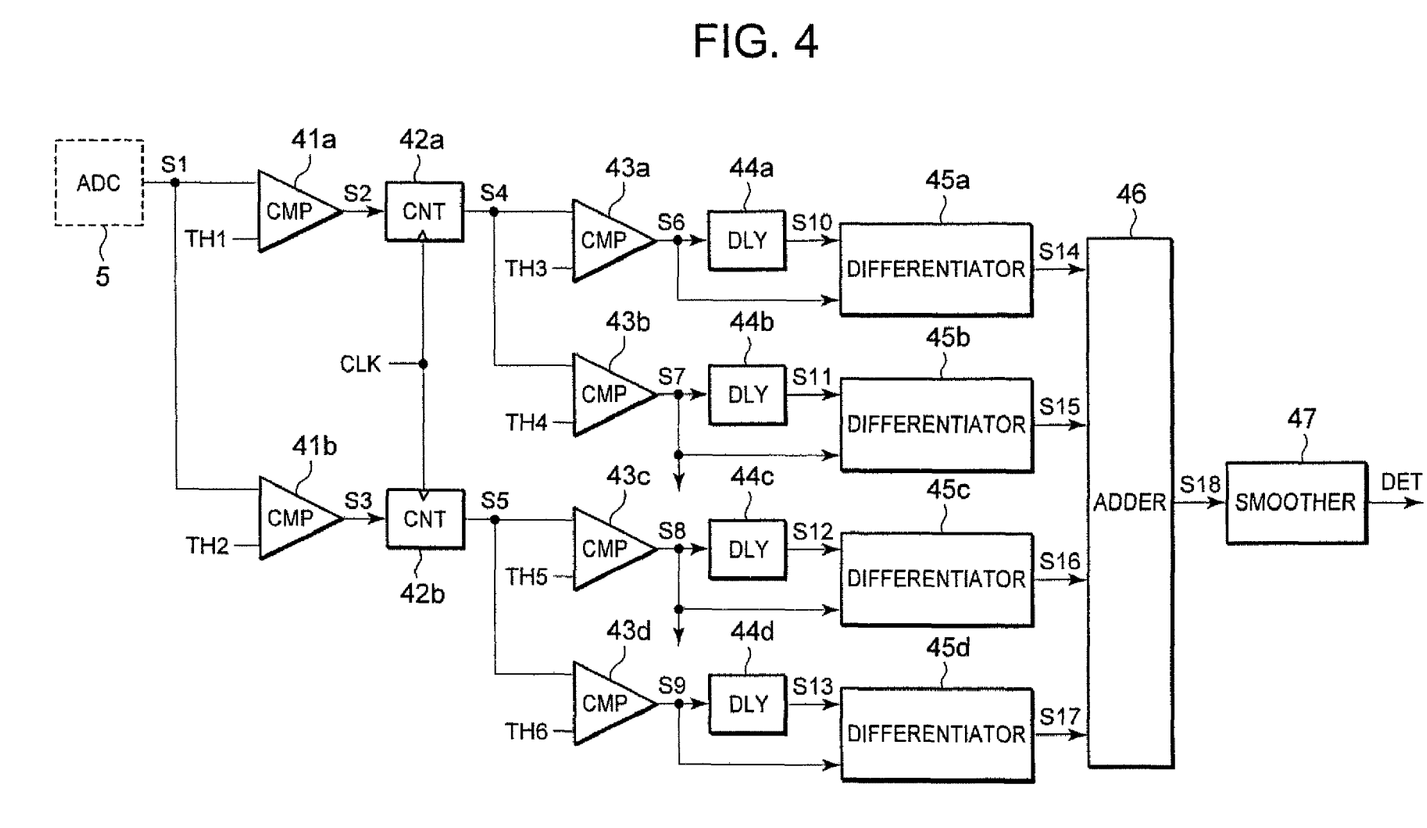
FIG. 4 is a block diagram showing a Doppler frequency estimating circuit according to a second embodiment of the present invention.

FIG. 4 is a block diagram of a Doppler frequency estimating circuit according to a second embodiment of the present invention. The Doppler frequency estimating circuit corresponds to the level control circuit 10 and Doppler frequency detector 20 shown in FIG. 1. The Doppler frequency estimating circuit can be used as an alternative to these level control circuit 10 and Doppler frequency detector 20.

The Doppler frequency estimating circuit has comparators 41$a$ and 41$b$ which compare a signal S1 outputted from an ADC 5 with threshold values TH1 and TH2 (where TH1>TH2) respectively. The comparator 41$a$ outputs a signal S2 brought to "1" when S1>TH1 and brought to "0" when other than it. The comparator 41$b$ outputs a signal S3 brought to "1" when S1>TH2 and brought to "0" when other than it. The signals S2 and S3 are respectively supplied to counters 42$a$ and 42$b$.

The counter 42$a$ counts a sampling clock CLK when the signal S2 supplied from the comparator 41$a$ is "1". A count value S4 thereof is supplied to comparators 43$a$ and 43$b$. The counter 42$b$ counts a sampling clock CLK when the signal S3 supplied from the comparator 41$b$ is "1". A count value S5 thereof is supplied to comparators 43$c$ and 43$d$.

The comparators 43$a$ and 43$b$ compare the count value S4 of the counter 42$a$ with threshold values TH3 and TH4 (where TH3≠TH4) respectively. The comparator 43$a$ outputs a signal S6 brought to "−1" when S4>TH3 and brought to "+1" when other than it. The comparator 43$b$ outputs a signal S7 brought to "−1" when S4>TH4 and brought to "+1" when other than it.

The comparators 43$c$ and 43$d$ compare the count value S5 of the counter 42$b$ with threshold values TH5 and TH6 (where TH5≠TH6) respectively. The comparator 43$c$ outputs a signal S8 brought to "−1" when S5>TH5 and brought to "+1" when other than it. The comparator 43$d$ outputs a signal S9 brought to "−1" when S5>TH6 and brought to "+1" when other than it.

The signal S6 of the comparator 43$a$ is supplied to a delayer (DLY) 44$a$ and a differential unit or differentiator 45$a$. The delayer 44$a$ delays the signal S6 by one OFDM symbol time. A signal S10 outputted therefrom is supplied to the differentiator 45$a$. Similarly, the signals S7 through S9 of the comparators 43$b$ through 43$d$ are respectively supplied to delayers 44$b$ through 44$d$ and differentiators 45$b$ through 45$d$ similar to the above. The signals S7 and S8 are supplied to the DAC 7 shown in FIG. 1, for example, where they are used as signals for AGC control.

The differentiators 45$a$ through 45$d$ calculate differences between two values inputted thereto and output the so-calculated results as signals S14 through S17 respectively. The signals S14 through S17 are supplied to an adder 46. The adder 46 adds together the signals S14 through S17 and outputs a signal indicative of the result of addition. The signal S18 is supplied to a smoothing unit or smoother 47. The smoother 47 is a low pass filter that removes high frequency components contained in the signal S18 and outputs a Doppler detection signal DET.

The operation of the Doppler frequency estimating circuit is as follows:

A signal S1$n$ corresponding to an nth OFDM symbol is compared with the threshold values TH1 and TH2 by the comparators 41$a$ and 41$b$ respectively. A signal S2$n$ brought to "1" when S1$n$>TH1 and brought to "0" when S1$n$≦TH1 is outputted from the comparator 41$a$. A signal S3$n$ brought to "1" when S1$n$>TH2 and brought to "0" when S1$n$≦TH2 is outputted from the comparator 41$b$.

The signals S2$n$ and S3$n$ are respectively supplied to the counters 42$a$ and 42$b$, which count a sampling clock CLK and output counted results as count values S4 and S5. Thus, if the number of samples in one symbol is assumed to be N, then the count values S4 and S5 are expressed as follows:

$$S4 = \sum_{i=0}^{N-1} S2_{n-i}$$ (3)

$$S5 = \sum_{i=0}^{N-1} S3_{n-i}$$

Thus, the respective numbers of times that the signal S1 corresponding to the amplitude of a received signal has passed through arbitrary threshold values TH1 and TH2 within a desired time are determined as the count values S4 and S5.

The count value S4 is supplied to the comparators 43a and 43b, where it is compared with arbitrary threshold values TH3 and TH4 for estimating a Doppler frequency. The count value S5 is supplied to the comparators 43c and 43d, where it is compared with arbitrary threshold values TH5 and TH6 for estimating a Doppler frequency. Of these, the threshold values TH4 and TH5 are threshold values used even for control of received power, and the threshold values TH3 and TH6 are threshold values used only for estimating the Doppler frequency.

The signal S6 outputted from the comparator 43a is delayed by the delayer 44a and obtained as a signal S10. The difference between the signal S10 and the signal S6 outputted from the comparator 43a with the next timing is calculated by the differentiator 45a and outputted to the adder 46 as a signal S14. The signals S7 through S9 outputted from the comparators 43b through 43d are also processed in like manner. Differences between the signals S7 through S9 and values of one-symbol cycle past are respectively calculated by the delayers 44b through 44d and the differentiators 45b through 45d, and the resultant signals S15 through S17 are outputted to the adder 46.

The adder 46 adds the signals S14 through S17 and outputs a signal S18 indicative of the result of addition to the smoother 47. The smoother 47 removes high frequency components contained in the signal S18 and outputs a Doppler detection signal DET for estimating a Doppler frequency.

As described above, the Doppler frequency estimating circuit generates the Doppler detection signal DET for estimating the Doppler frequency without performing power calculations by simply counting the results of comparison. Thus, an advantage is brought about in that an arithmetic or operational scale is reduced and the Doppler frequency can be estimated with satisfactory accuracy even at high-speed movement or the like.

Third Preferred Embodiment

Figure 5:
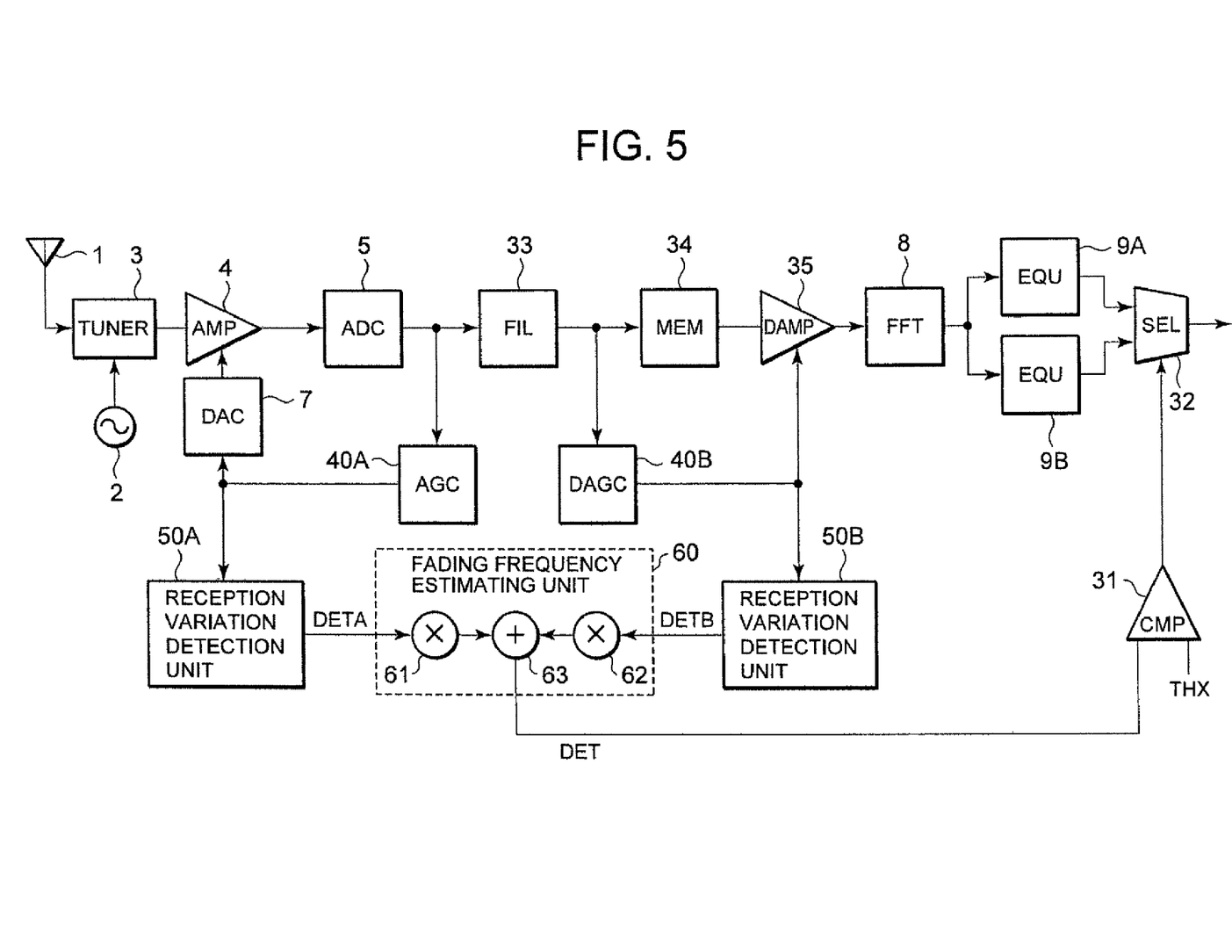
FIG. 5 is a schematic block diagram showing a digital terrestrial broadcasting receiver according to a third embodiment of the present invention.

FIG. 5 is a schematic block diagram showing a digital terrestrial broadcasting receiver according to a third embodiment of the present invention. Elements common to those shown in FIG. 1 are respectively given common reference numerals.

The digital terrestrial broadcasting receiver includes a digital filter (FIL) 33, a memory (MEM) 34 and a digital variable or programmable gain amplifier (called "DAMP") 35 inserted between the ADC 5 and FFT 8 shown in FIG. 1. Further, the digital terrestrial broadcasting receiver is provided with an AGC controller (AGC) 40A, a digital AGC controller (DAGC) 40B, reception variation detection units 50A and 50B, and a fading frequency estimating unit 60 as an alternative to the level control circuit 10 and Doppler frequency detector 20.

The digital filter 33 removes a signal lying in an unnecessary band from a digital received signal outputted from the ADC 5. The memory 34 retains the received signal in the unit of a gain control cycle at the DAMP 35. The DAMP 35 amplifies the received signal held in the memory 34 in accordance with a gain control signal supplied from the digital AGC controller 40B periodically and supplies it to the FFT B.

The AGC controller 40A generates a gain control signal, based on the received signal outputted from the ADC 5 and supplies it to a DAC 7 and the reception variation detection unit 50A. The digital AGC controller 40B generates a gain control signal, based on the received signal outputted from the digital filter 33 and supplies it to the DAMP 35 and the reception variation detection unit 50B.

The reception variation detection units 50A and 50B respectively detect the rates of variations in received signal, based on the gain control signals supplied from the AGC controller 40A and the digital AGC controller 40B. Detection signals DETA and DETB respectively outputted from the reception variation detection units 50A and 50B are supplied to the fading frequency estimating unit 60. The fading frequency estimating unit 60 comprises multipliers 61 and 62 and an adder 63. The fading frequency estimating unit 60 weight adds the detection signals DETA and DETB at a predetermined rate thereby to estimate a fading frequency and outputs a detection signal DET therefrom. The detection signal DET is supplied to a comparator 31.

Here, specific configurations of the AGC controller 40A and the reception variation detection unit 50A are similar to the Doppler frequency estimating circuit shown in FIG. 4. That is, the comparators 41a and 41b, counters 42a and 42b and comparators 43a through 43d shown in FIG. 4 correspond to the AGC controller 40A, whereas the delayers 44b through 44d, differentiators 45a through 45d, adder 46 and smoother 47 correspond to the reception variation detection unit 50A. Similarly, specific configurations of the digital AGC controller 40B and the reception variation detection unit 50B are similar to the Doppler frequency estimating circuit shown in FIG. 4.

The operation of the digital terrestrial broadcasting receiver will next be explained with the focus on measures to fading.

A radiofrequency signal RF received by an antenna 1 is selected by a tuner 3 and converted to an intermediate frequency signal IF, which in turn is amplified to a predetermined level by an AMP 4, followed by being supplied to the ADC 5, after which it is converted to a digital value. The received signal converted to the digital value by the ADC 5 is supplied to the AGC controller 40A and held in the memory 34 via the digital filter 33. Further, the received signal is supplied to the digital AGC controller 40B.

The received signal supplied to the AGC controller 40A is compared with threshold values TH1 and TH2 by the comparators 41a and 41b respectively as shown in FIG. 4. Signals S2 and S3 indicative of the results of comparison thereby are supplied to the counters 42a and 42b, where they are counted in accordance with a sampling clock CLK.

A count value S4 of the counter 42a is supplied to the comparators 43a and 43b, where it is compared with threshold values TH3 and TH4 for estimating a Doppler frequency. A count value S5 of the counter 42b is supplied to the comparators 43c and 43d, where it is compared with threshold values TH5 and TH6 for estimating a Doppler frequency. Of these, the threshold values TH4 and TH5 are threshold values used even for control of received power, and the threshold values TH3 and TH6 are threshold values used only for estimating the Doppler frequency.

A signal S7 indicative of the result of comparison between the count value S4 and the threshold value TH4, and a signal S8 indicative of the result of comparison between the count value S5 and the threshold value TH5 are supplied to the DAC 7 as signals for the received power control, where they are converted to analog signals, followed by being supplied to the AMP 4. It is possible to cover a wide dynamic range by virtue of this analog gain control by the AMP 4.

On the other hand, the received signal supplied to the digital AGC controller 40B via the digital filter 33 is compared with threshold values by the comparators in a manner similar to the operation of the AGC controller 40A. Signals indicative of the results of comparison by the comparators are supplied to their corresponding counters, where they are counted in accordance with a sampling clock CLK.

Count values of the counters are supplied to their corresponding comparators from which a signal for estimating a Doppler frequency and a signal used even for received power control are generated. Of these, the signal used for the received power control is supplied to the DAMP 35, where the gain of the received signal read from the memory 34 is controlled. This digital DAMP 35 performs high-accuracy gain control.

The received signal controlled in gain by the DAMP 35 is supplied to the FFT 8, where it is separated into signals set every carrier, which in turn are supplied to equalizers 9A and 9B. The equalizers 9A and 9B make synchronization between the carriers in accordance with their characteristics to produce received data. Signals outputted from the equalizers 9A and 9B are supplied to a selector 32, where one thereof is selected in accordance with a select signal and played back or reproduced as video and voice.

The signals S6 through S9 outputted from the AGC controller 40A are supplied to the reception variation detection unit 50A. At the reception variation detector 50A, the signal S6 is delayed by the delayer 44a and obtained as a signal S10 as shown in FIG. 4. The difference between the signal S10 and the signal S6 outputted from the comparator 43a with the next timing is calculated by the differentiator 45a and outputted to the adder 46 as a signal S14. The signals S7 through S9 are also processed in like manner. Differences between the signals S7 through S9 and values of one-symbol cycle past are respectively calculated by the delayers 44b through 44d and the differentiators 45b through 45d, and the resultant signals S15 through S17 are outputted to the adder 46.

The adder 46 adds the signals S14 through S17. The smoother 47 removes high frequency components contained in a signal S18 indicative of the result of addition and outputs a Doppler detection signal DETA for estimating a Doppler frequency. Similarly, the signal outputted from the digital AGC controller 40B is supplied to the reception variation detection unit 50B from which a Doppler detection signal DETB for estimating a Doppler frequency is outputted.

The Doppler detection signals DETA and DETB are supplied to the Doppler frequency estimating unit 60, where they are weight added, whereby a fading frequency estimated value DET is produced. The fading frequency estimated value DET is compared with a threshold value THX at a comparator 31. When the fading frequency estimated value DET exceeds the threshold value THX, the equalizer 9A that emphasizes the speed of response is selected. When the fading frequency estimated value DET is less than or equal to the threshold value THX, the equalizer 9B that emphasizes accuracy and stability is selected.

As described above, the digital terrestrial broadcasting receiver has a configuration in which an analog type automatic gain control amplifying circuit and a digital type automatic gain control amplifying circuit are connected in tandem. The analog type automatic gain control amplifying circuit has a problem in that although it can cover a wide dynamic range, a delay occurs in gain control because the gain control is carried out in real time. That is, when a delay occurs in a state in which signal power is always varying due to a variation in propagation path, power of a signal having produced information on the gain control and power of a gain-controlled signal are shifted by such a delay. This difference results in an error of gain control.

On the other hand, in the digital type automatic gain control amplifying circuit, each signal that has produced information on gain control is temporarily held in the memory 34 simultaneously, and the signal read from the memory 34 can be amplified in accordance with the produced information on gain control. Thus, since the signal that has produced the information on the gain control, and the gain-controlled signal result in the same signal, high-accuracy gain control is enabled.

Further, the reception variation detection units 50A and 50B respectively produce the Doppler detection signals DETA and DETB from the control signals obtained by the analog type AGC controller 40A and the digital type DAGC controller 40B. The fading frequency estimating unit 60 weight add the Doppler detection signals DETA and DETB and thereby calculates the fading frequency estimated value DET. Consequently, a circuit used for the calculation of received power and the like becomes unnecessary, and a high-accuracy fading frequency estimated value DET is obtained with a simplified circuit configuration.

Fourth Preferred Embodiment

Although the third embodiment has explained the configurations of the AGC controller 40A and the digital AGC controller 40B as being similar to those in FIG. 4, such a configuration that a signal power estimated value s–power (T) for generating each gain control signal is computed in the following manner, can be adopted:

$$s-\text{power}(T) = \sum_{k=1}^{n} s-\text{sig}(T, k) \qquad (4)$$

where s–sig (T, k): received signal

T: control signal generation cycle k: order of size of signals lying within control signal generation cycle (maximum: 1), and n: arbitrary value indicative of order from high order one of signals lying within control signal generation cycle.

This computation can be done in accordance with the following procedures 1 through 4.

(Procedure 1)

The values of signals that will pass every predetermined time (i.e., control signal generation cycle) are held in order from the largest one thereof.

(Procedure 2)

The held maximum to nth values are summed and the result thereof is assumed to be an estimated value for received signal power.

(Procedure 3)

A value equivalent to a value obtained by dividing a reference value by an estimated value is generated in such a manner that the estimated value becomes a constant value, and the generated value is assumed to be control information.

(Procedure 4)

Further, the reception variation detection units 50A and 50B respectively determine the difference between the present control information and immediately-preceding control information and smooth the same with the existence of its difference as being 1 and non-existence thereof as being 0, thereby generating Doppler detection signals DETA and DETB.

It is thus possible to simplify arithmetic processing.

Incidentally, the present invention is not limited to the above embodiments. Various modifications can be made. As examples of the modifications, the following ones are brought about, for example.

(a) Although the two types of equalizers 9A and 9B are selected in accordance with the Doppler detection signal DET in FIG. 1, three or more types of equalizers may be used and switched based on the value of a Doppler detection signal DET.

(b) Although the two types of equalizers 9A and 9B are selected in accordance with the Doppler detection signal DET, equalizers capable of setting parameters externally are used and the parameters may be set in accordance with a Doppler detection signal DET.

(c) The configuration of the level control circuit 10 is illustrated as one example. If one that produces the control signal CON used as the source of the gain control signal AGC is adopted, then any configuration may be taken.

(d) The configuration of the Doppler frequency detector 20 is not limited to one illustrated in the drawing. That is, such a configuration that the frequency of the gain control signal AGC can be detected may be adopted.

(e) The configuration of the fading frequency estimating unit 60 is not limited to one illustrated in the drawing. The fading frequency estimating unit 60 can be simplified by using a shift circuit as an alternative to the multipliers 61 and 62, for example.

What is claimed is:

1. An OFDM receiver comprising:
   a tuner which receives a radiofrequency signal subjected to orthogonal frequency division multiplex modulation therein and converts the same to an intermediate frequency signal;
   a variable gain amplifier which amplifies the intermediate frequency signal in accordance with a gain control signal;
   an analog-digital converter which converts the signal amplified by the variable gain amplifier to a digital signal;
   a fast Fourier transformer which transforms the digital signal into signals in a frequency domain corresponding to a plurality of carriers;
   an equalizer which processes the signals outputted from the fast Fourier transformer in accordance with a Doppler detection signal thereby to make synchronization between the carriers so as to produce received data;
   a level control circuit which generates a control signal corresponding to the gain control signal, for bringing an average level of the digital signal to a predetermined level, based on the digital signal;
   a digital-analog converter which analog-converts the control signal to produce the gain control signal; and
   a Doppler frequency detector which extracts frequency components of the control signal thereby to produce the Doppler detection signal.

2. The OFDM receiver according to claim 1, wherein the equalizer comprises a plurality of equalizers different in characteristic and a selector which selects one of the equalizers in accordance with a select signal, and
   wherein the Doppler frequency detector outputs a select signal for the selector, based on the produced Doppler detection signal.

3. The OFDM receiver according to claim 1, wherein the equalizer is capable of controlling a characteristic by setting a parameter externally, and
   wherein the Doppler frequency detector outputs a parameter for the equalizer, based on the produced Doppler detection signal.

4. The OFDM receiver according to claim 1, 2 or 3, wherein the Doppler frequency detector includes:
   a differential unit which calculates a rate of change in the control signal,
   a 0-cross detection unit which outputs a pulse signal when the rate of change calculated by the differential unit changes from positive to negative or from negative to positive,
   a pulse counter which counts the pulse signal outputted from the 0-cross detection unit every predetermined period and outputs a count value thereof, and
   a smoothing unit which removes high frequency components of the counted number outputted from the pulse counter and outputs the Doppler detection signal.

5. An OFDM receiver comprising:
   a tuner which receives a radiofrequency signal subjected to orthogonal frequency division multiplex modulation therein and converts the same to an intermediate frequency signal;
   a first variable gain amplifier which amplifies the intermediate frequency signal in accordance with a first gain control signal;
   an analog-digital converter which converts the signal amplified by the first variable gain amplifier to a digital signal;
   a first gain control unit which generates a first control signal corresponding to the first gain control signal, for bringing an average level of the digital signal to a predetermined level, based on the digital signal;
   a digital-analog converter which analog-converts the first control signal to produce the first gain control signal;
   a second gain control unit which generates a second control signal, based on the digital signal;
   a memory which holds the digital signal therein by a predetermined cycle;
   a second variable gain amplifier which reads the digital signal held in the memory and amplifies the same in accordance with the second control signal;
   a fast Fourier transformer which transforms an output signal of the second variable gain amplifier into signals in a frequency domain corresponding to a plurality of carriers;
   a plurality of equalizers which process the signals outputted from the fast Fourier transformer thereby to make synchronization between the carriers so as to produce received data;
   a first reception variation detection unit which generates a first Doppler detection signal in accordance with the first control signal;
   a second reception variation detection unit which generates a second Doppler detection signal in accordance with the second control signal;

a fading frequency estimating unit which weight adds the first and second Doppler detection signals thereby to calculate a fading frequency; and a selection unit which selects one from the equalizers according to the fading frequency and selects received data of the selected equalizer as the received signal.

6. The OFDM receiver according to claim 5, wherein a filter which removes unnecessary components contained in the digital signal outputted from the digital-analog converter is provided between the digital-analog converter, and the second gain control unit and the memory.

7. The OFDM receiver according to claim 5, wherein the first and second gain control units and reception variation detection units respectively hold the values of the digital signals in order from the larger ones thereof every predetermined time, combines the values of the digital signals from the maximum of the held values of digital signals to arbitrary order thereof to calculate a received power estimated value, and generate the first and second Doppler detection signals, based on a variation in the received power estimated value.

8. The OFDM receiver according to claim 6, wherein the first and second gain control units and reception variation detection units respectively hold the values of the digital signals in order from the larger ones thereof every predetermined time, combines the values of the digital signals from the maximum of the held values of digital signals to arbitrary order thereof to calculate a received power estimated value, and generate the first and second Doppler detection signals, based on a variation in the received power estimated value.

* * * * *